(12) United States Patent
Kushiyama et al.

(10) Patent No.: US 7,113,007 B2
(45) Date of Patent: Sep. 26, 2006

(54) DRIVER CIRCUIT AND SYSTEM INCLUDING DRIVER CIRCUIT

(75) Inventors: Natsuki Kushiyama, Kanagawa (JP); Ryubi Okuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 14 days.

(21) Appl. No.: 10/965,661

(22) Filed: Oct. 15, 2004

(65) Prior Publication Data

US 2005/0218941 A1  Oct. 6, 2005

(30) Foreign Application Priority Data

Mar. 31, 2004  (JP) ............................. 2004-107086

(51) Int. Cl.
*H03K 3/00* (2006.01)
(52) U.S. Cl. ...................................... 327/108; 327/112
(58) Field of Classification Search ......... 327/108–112
See application file for complete search history.

(56) References Cited

U.S. PATENT DOCUMENTS

| 5,298,804 A | * | 3/1994 | Shichinohe | .................. 326/63 |
| 5,343,099 A | * | 8/1994 | Shichinohe | ................. 327/108 |
| 6,570,415 B1 | * | 5/2003 | Chen et al. | ................. 327/108 |

FOREIGN PATENT DOCUMENTS

JP  02-143609  6/1990

* cited by examiner

*Primary Examiner*—Kenneth B. Wells
(74) *Attorney, Agent, or Firm*—Banner & Witcoff Ltd (57) ABSTRACT

A driver circuit disclosed herein comprises a first inverter which comprises: a first transistor which is connected between a first power supply with a first voltage and a first output node; a second transistor which is connected between the first output node and a second power supply with a second voltage; and a voltage maintaining circuit which is provided between the second power supply and the second transistor and which maintains a voltage of the first output node in the vicinity of a threshold voltage of a transistor which is connected to the first output node even when the second transistor is turned on.

20 Claims, 13 Drawing Sheets

DRIVER CIRCUIT AND SYSTEM INCLUDING DRIVER CIRCUIT

CROSS REFERENCE TO RELATED APPLICATION

This application claims benefit of priority under 35 U.S.C. §119 to Japanese Patent Application No. 2004-107086, filed on Mar. 31, 2004, the entire contents of which are incorporated by reference herein.

BACKGROUND OF THE INVENTION

1. Field of the Invention

The present invention relates to a driver circuit and a system including a driver circuit, and particularly relates to a driver circuit having a predriver in a stage previous to an output driver and a system including such a driver circuit.

2. Background Art

Figure 1:
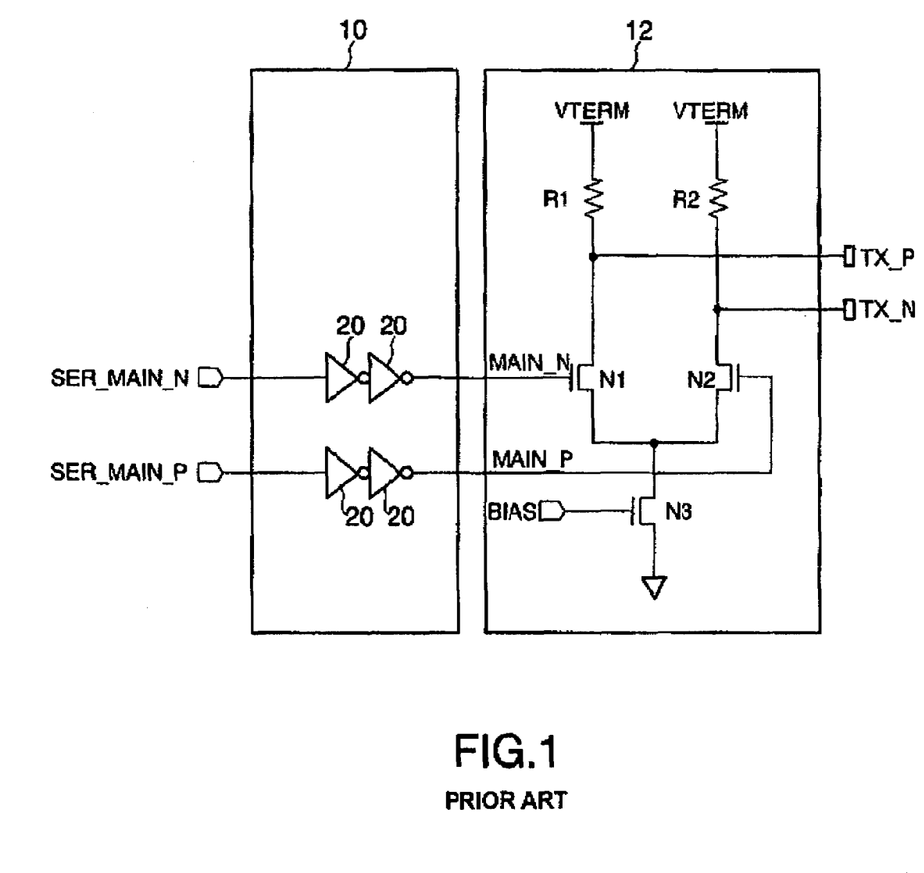
FIG. 1 is a circuit diagram showing the configuration of a related driver circuit.

FIG. 1 is a diagram showing the configuration of a related driver circuit. As shown in FIG. 1, the driver circuit includes a predriver 10 and an output driver 12.

The predriver 10 is configured by connecting plural CMOS inverters 20 in series. The output driver 12 is a CML (Current Mode Logic) type output driver and includes N-type MOS transistors N1, N2, and N3 and resistances R1 and R2.

A bias voltage BIAS is applied to the transistor N3, and hence the transistor N3 functions as a constant current source.

Figure 2:
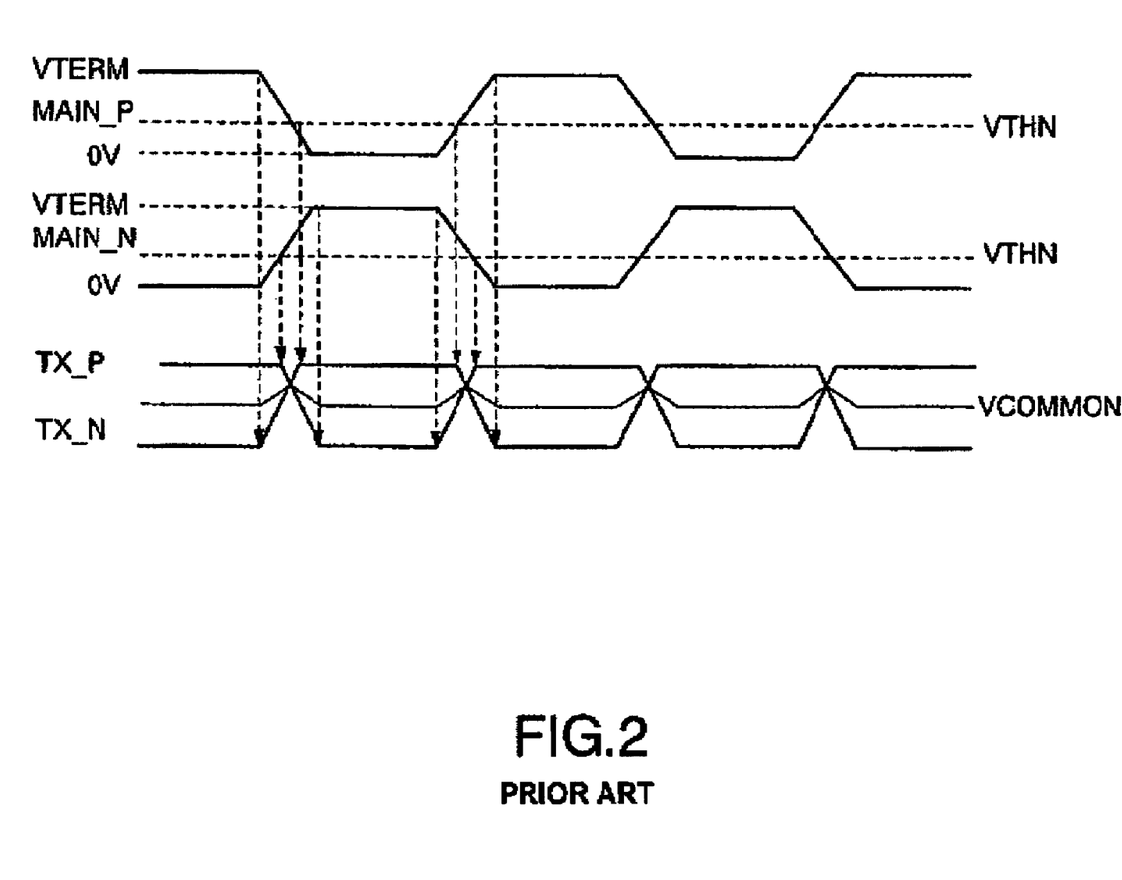
FIG. 2 is a diagram showing operation waveforms of the driver circuit in FIG. 1.

FIG. 2 is a diagram showing operation waveforms of the driver circuit shown in FIG. 1. As shown in FIG. 2, a node MAIN_P and a node MAIN_N which are output nodes of the predriver 10 oscillate, for example, between 0 V and a voltage VTERM.

If threshold voltages of the transistors N1 and N2 are VTHN, the transistor N1 remains off while the voltage of the node MAIN_N is between 0 V and the voltage VTHN when the node MAIN_N rises from low (0 V) to high (voltage VTERM). Accordingly, the voltage of an output terminal TX_P does not drop. Then, the voltage of the output terminal TX_P starts to drop only after the voltage of the node MAIN_N has reached VTHN.

On the other hand, the node MAIN_P drops from high (voltage VTERM) to low (0 V), and when the voltage of the node MAIN_P drops from the voltage VTERM to the voltage VTHN, the transistor N2 is turned off. Therefore, at this point, the voltage of an output terminal TX_N rises to high (voltage VTERM).

As described above, on/off timings of the transistor N1 and the transistor N2 do not coincide, whereby a voltage waveform of the output terminal TX_P and a voltage waveform of the output terminal TX_N are not perfect differential waveforms. Therefore, as shown in FIG. 2, an intersection point (VCOMMON) of the voltage waveform of the output terminal TX_P and the voltage waveform of the output terminal TX_N when the output switches between high and low has a higher potential than an intermediate potential. Namely, {(voltage of output terminal TX_P)+(voltage of output terminal TX_N)}/2=VCOMMON is not a constant value.

However, specifications needed for the driver circuit sometimes require that VCOMMON is constant (fluctuations are within a predetermined range), for example, as in the case of PCI-EXPRESS. In such specifications, it is necessary to avoid fluctuations in VCOMMON in the driver circuit as much as possible.

SUMMARY OF THE INVENTION

In order to accomplish the aforementioned and other objects, according to one aspect of the present invention, a driver circuit, comprises a first inverter which comprises:

a first transistor which is connected between a first power supply with a first voltage and a first output node;

a second transistor which is connected between the first output node and a second power supply with a second voltage; and a voltage maintaining circuit which is provided between the second power supply and the second transistor and which maintains a voltage of the first output node in the vicinity of a threshold voltage of a transistor which is connected to the first output node even when the second transistor is turned on.

According to another aspect of the present invention, a system including a driver circuit comprises a first inverter which comprises:

a first transistor which is connected between a first power supply with a first voltage and a first output node;

a second transistor which is connected between the first output node and a second power supply with a second voltage; and a voltage maintaining circuit which is provided between the second power supply and the second transistor and which maintains a voltage of the first output node in the vicinity of a threshold voltage of a transistor which is connected to the first output node even when the second transistor is turned on.

DETAILED DESCRIPTION OF THE EMBODIMENTS

First Embodiment

Figure 3:
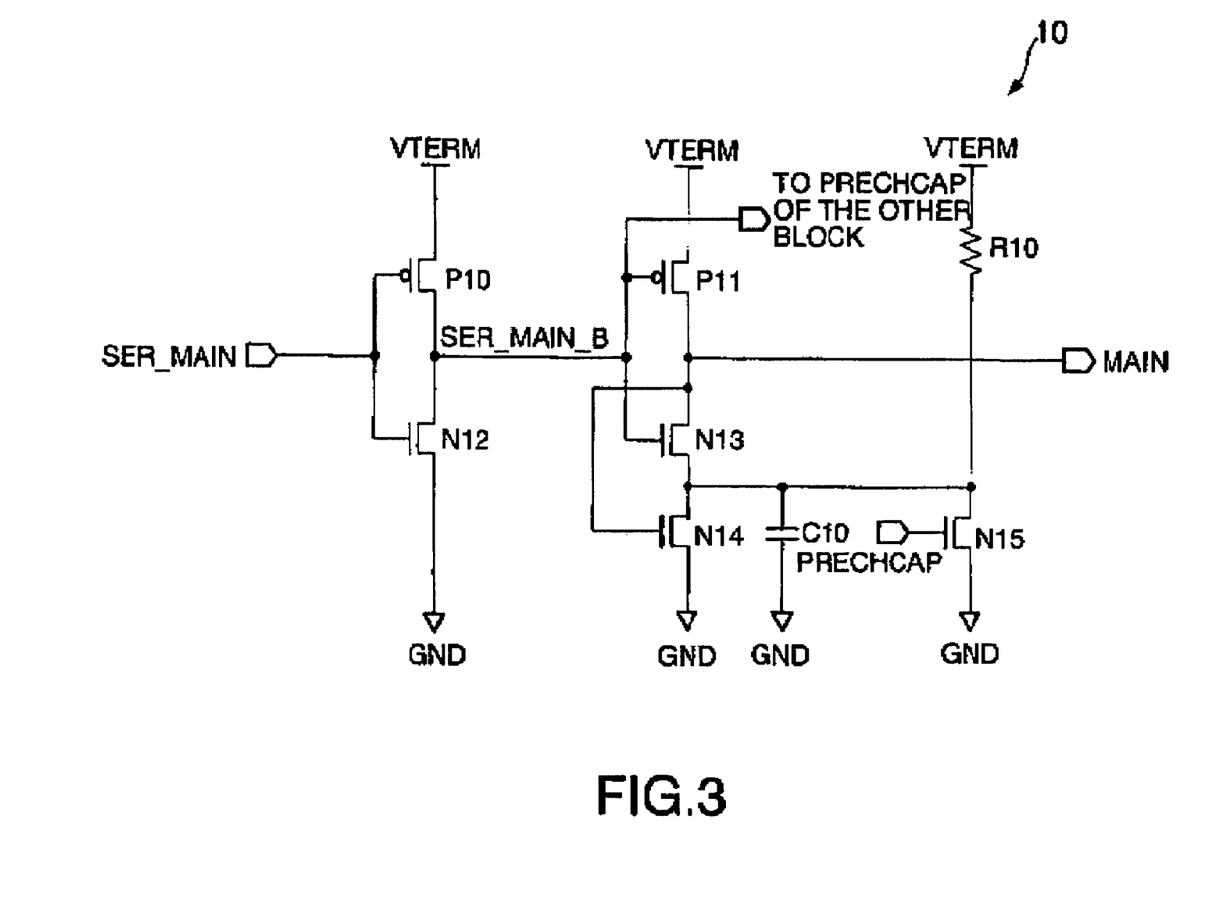
FIG. 3 is a circuit diagram showing the configuration of one block in a predriver according to a first embodiment.

FIG. 3 is a diagram showing the configuration of a predriver 10 according to the first embodiment. FIG. 3 shows the configuration of only either a MAIN_P side or a MAIN_N side. Namely, a circuit corresponding to two stage inverters is shown.

As shown in FIG. 3, the predriver circuit 10 according to this embodiment includes P-type MOS transistors P10 and P11, N-type MOS transistors N12 to N15, a capacitor C10, and a resistance R10.

More specifically, the transistor P10 and the transistor N12 which are connected in series between a power supply with a voltage VTERM and a ground GND constitute a CMOS inverter. A voltage signal inputted from a terminal SER_MAIN is inputted to a gate of the transistor P10 and a gate of the transistor N12. An output of the CMOS inverter is outputted from a node SER_MAIN_B between the transistor P10 and the transistor N12.

Similarly, the transistor P11 and the transistor N13 which are connected in series between the power supply with the voltage VTERM and the ground GND constitute a CMOS inverter, and the node SER_MAIN_B is connected to a gate of the transistor P11 and a gate of the transistor N13. An output of this CMOS inverter is outputted from a node MAIN between the transistor P11 and the transistor N13. This node MAIN is connected to a gate of a transistor N1 or a gate of a transistor N2 in an output driver 12 in FIG. 1.

A gate of the transistor N14 connected between the transistor N13 and the ground GND is connected to the node MAIN. Namely, the transistor 14 is diode-connected. Hence, when the node MAIN is low, the transistor N14 is off, and when the node MAIN is high, the transistor N14 is on.

The capacitor C10 and the transistor N15 are connected in parallel between a node, which is between the transistor N13 and the transistor N14, and the ground GND. A PRECHCAP signal is inputted to a gate of the transistor N15. This PRECHCAP signal is inputted from SER_MAIN_B of the other inverter which constitutes a complementary block.

When the PRECHCAP signal is high, the transistor N15 is on, and electric charge accumulated in the capacitor C10 is discharged. On the other hand, when the PRECHCAP signal is low, the transistor N15 is off, and electric charge is accumulated in the capacitor C10.

One end of the resistance R10 is connected to the power supply with the voltage VTERM, and the other end of the resistance R10 is connected to the capacitor C10. Therefore, even when both the transistors N14 and N15 are off, an electric current flows into the capacitor C10 from the power supply with the voltage VTERM through the resistance R10.

Figure 4:
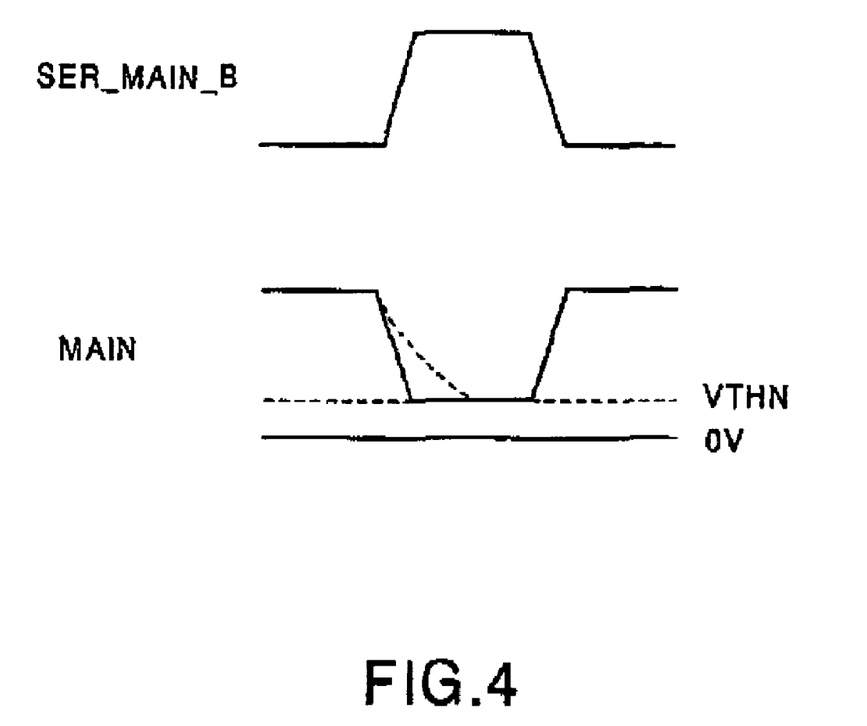
FIG. 4 is a diagram showing operation waveforms of the predriver circuit in FIG. 3.

As shown in FIG. 4, it is assumed that the voltage of the node SER_MAIN_B switches from low to high. In this case, the transistor P11 is turned off, and the transistor N13 is turned on. Consequently, the node MAIN goes low, and the transistor 14 is turned off. The timing in which the transistor N14 is turned off is a point in time when the voltage of the node MAIN has dropped to a threshold voltage VTHN of the N-type transistor. Accordingly, the voltage of the node MAIN becomes constant at the voltage VTHN without dropping to 0 V. In other words, the voltage of the node MAIN is maintained in the vicinity of the threshold voltage of the transistor N1 to which the node MAIN is connected.

Figure 5:
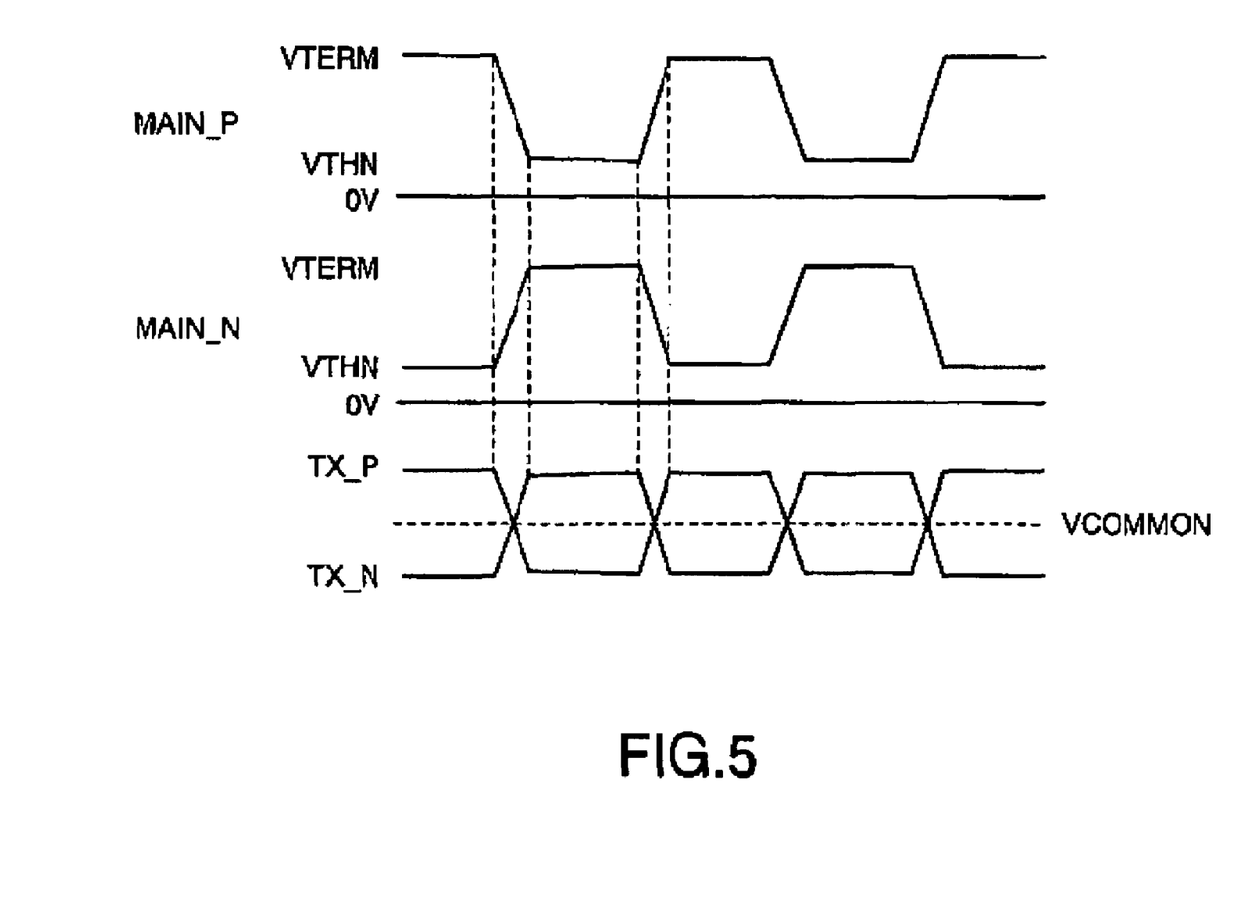
FIG. 5 is a diagram showing operation waveforms of a driver circuit which uses the predriver circuit in FIG. 3.

Hence, the timings of switching between "on" and "off" of the transistors N1 and N2 in the output driver 12 come to coincide, and as shown in FIG. 5, VCOMMON becomes constant. Namely, a voltage waveform of an output terminal TX_P and a voltage waveform of an output terminal TX_N can maintain differential waveforms, which can reduce fluctuations in the intermediate voltage VCOMMON to a minimum.

Incidentally, in the diode-connected transistor N14 in FIG. 3, the voltage change of the node MAIN is not as shown by a solid line but as shown by a broken line in FIG. 4 due to transistor characteristics. Namely, as the voltage of the node MAIN drops, the speed at which the voltage drops decreases.

Hence, in this embodiment, the capacitor C10 is provided. Namely, while the voltage of the node MAIN is high, the transistor N15 is on and electric charge in the capacitor C10 is discharged. At a point in time when the node SER_MAIN_B is high, the transistor N15 is turned off, and the capacitor C10 is brought into a state capable of accumulating electric charge.

Since electric charge is not accumulated in the capacitor C10, the voltage of the node MAIN is strongly pulled to ground and comes close to an ideal waveform such as shown by the solid line in FIG. 4. On this occasion, a voltage V of the node MAIN is determined in the following manner. Namely, the voltage V is fixed at a voltage calculated by $V=(C \times VTERM + C' \times 0)/(C+C')$ where C is a capacitance of the capacitor C10 and C' is a stray capacitance of the node MAIN. In other words, the voltage is fixed at a value obtained through capacitively dividing the voltage of the voltage VTERM and the ground GND by the capacitance of the capacitor C10 and the stray capacitance of the node MAIN. In this embodiment, the capacitively divided voltage V is set to be the threshold voltage VTHN of the N-type MOS transistor. Incidentally, the stray capacitance of the node MAIN is determined by the gate capacitance of the transistor N1 or the transistor N2 of the output driver 12, wire capacitance, and so on.

Moreover, even if the voltage of the node MAIN is constant at the threshold voltage VTHN, in reality, a sub-threshold leakage current exists in the transistor N14. If this leakage current continues flowing, the voltage of the node MAIN gradually drops from the voltage VTHN. Hence, in this embodiment, an electric current is supplied from the power supply with the voltage VTERM via the resistance R10. Consequently, the voltage of the node MAIN is maintained at the voltage VTHN.

As can be seen from the above, these transistor N14, transistor N15, capacitor C10, and resistance R10 constitute a voltage maintaining circuit in this embodiment.

Figure 6:
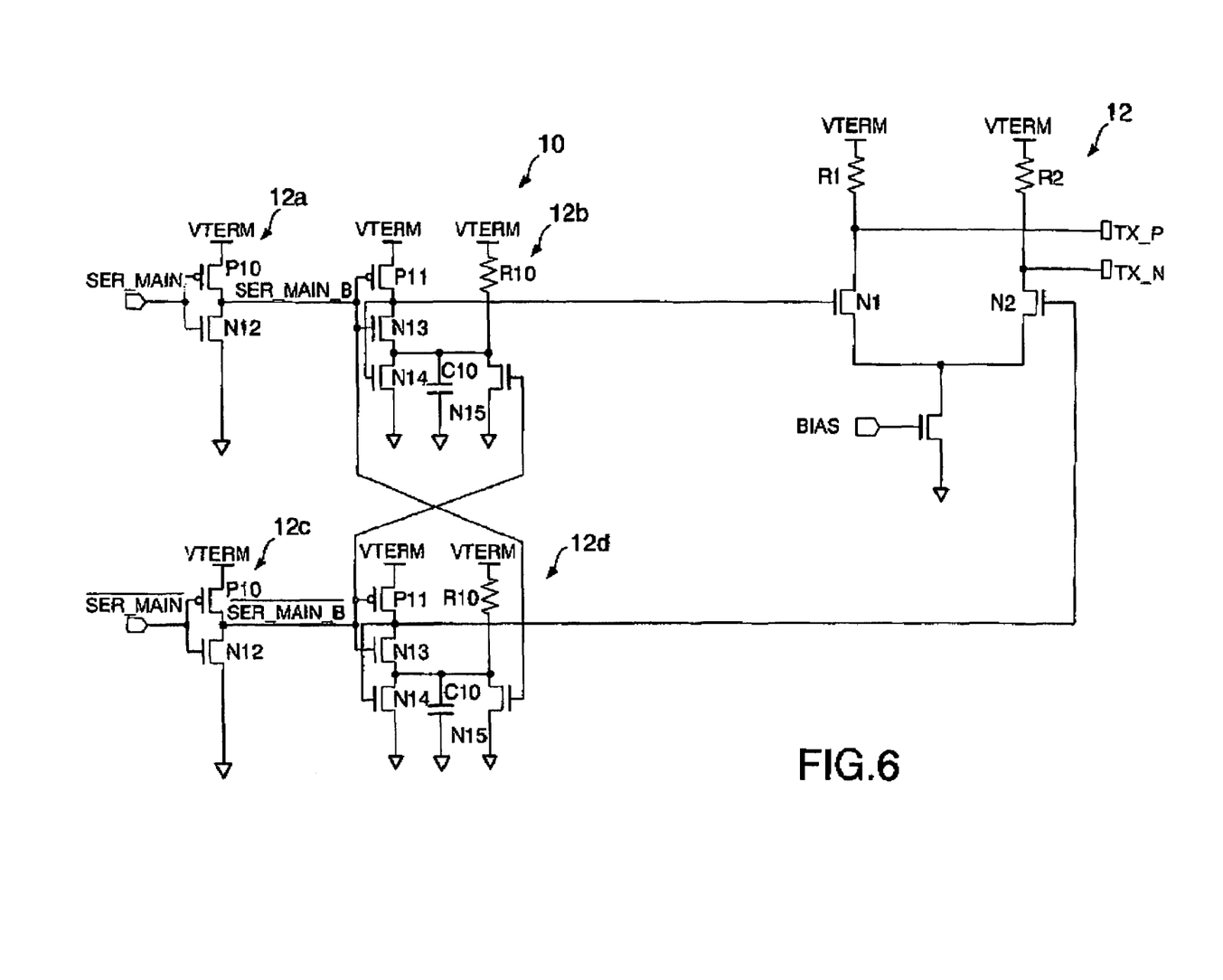
FIG. 6 is a circuit diagram showing the configuration of the driver circuit which uses the predriver according to the first embodiment.

FIG. 6 is a diagram showing the entire configuration of a driver circuit according to this embodiment. As shown in FIG. 6, the predriver 10 includes four inverters 12*a* to 12*d*. The inverter 12*a* and the inverter 12*b* constitute one block, and the inverter 12*c* and the inverter 12*d* constitute the other block.

As described above, an input signal of the node SER_MAIN_B of one block is inputted to the gate of the transistor N15 of the other block. More specifically, an input signal of the inverter 12*b* is inputted to the gate of the transistor N15 of the inverter 12*d*, and an input signal of the inverter 12*d* is inputted to the gate of the transistor N15 of the inverter 12*b*. The input signal of the inverter 12*b* and the input signal of the inverter 12*d* are complementary signals, and one signal is obtained by inverting the other, and vice versa. Thereby, while the input signal of the node SER_MAIN_B is low, the transistor N15 can be on, and electric charge can be discharged from the capacitor C10.

As described above, according to the driver circuit of this embodiment, fluctuations in the intermediate voltage VCOMMON of the voltage waveform of the output terminal TX_P and the voltage waveform of the output terminal TX_N can be minimized. Consequently, the precision of the differential output of the driver circuit can be improved.

Figure 7:
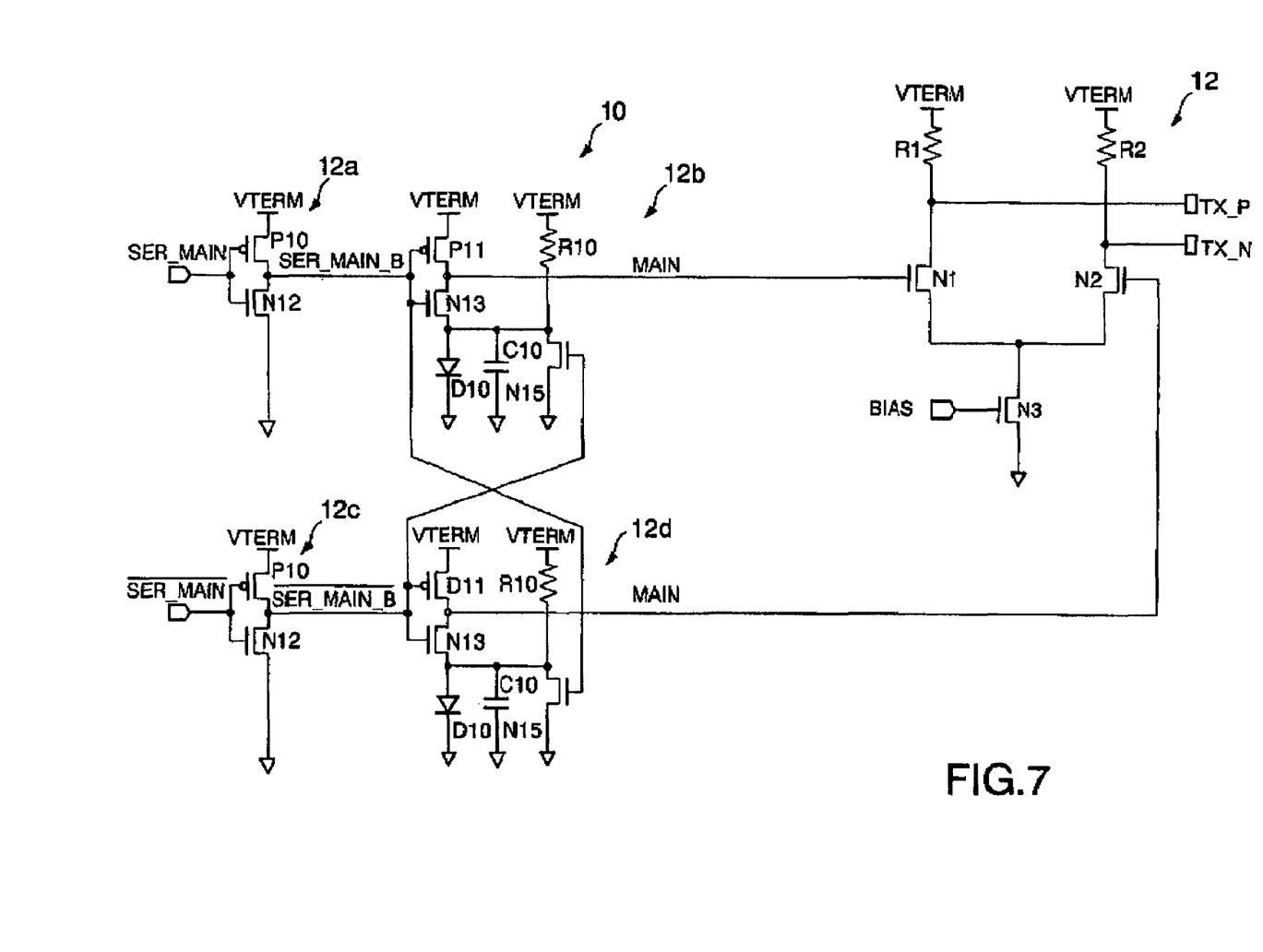
FIG. 7 is a diagram showing a modification of the driver circuit according to the first embodiment.

Incidentally, as shown in FIG. 7, the diode-connected transistor N14 can be replaced with a PN diode D10.

Second Embodiment

Figure 8:
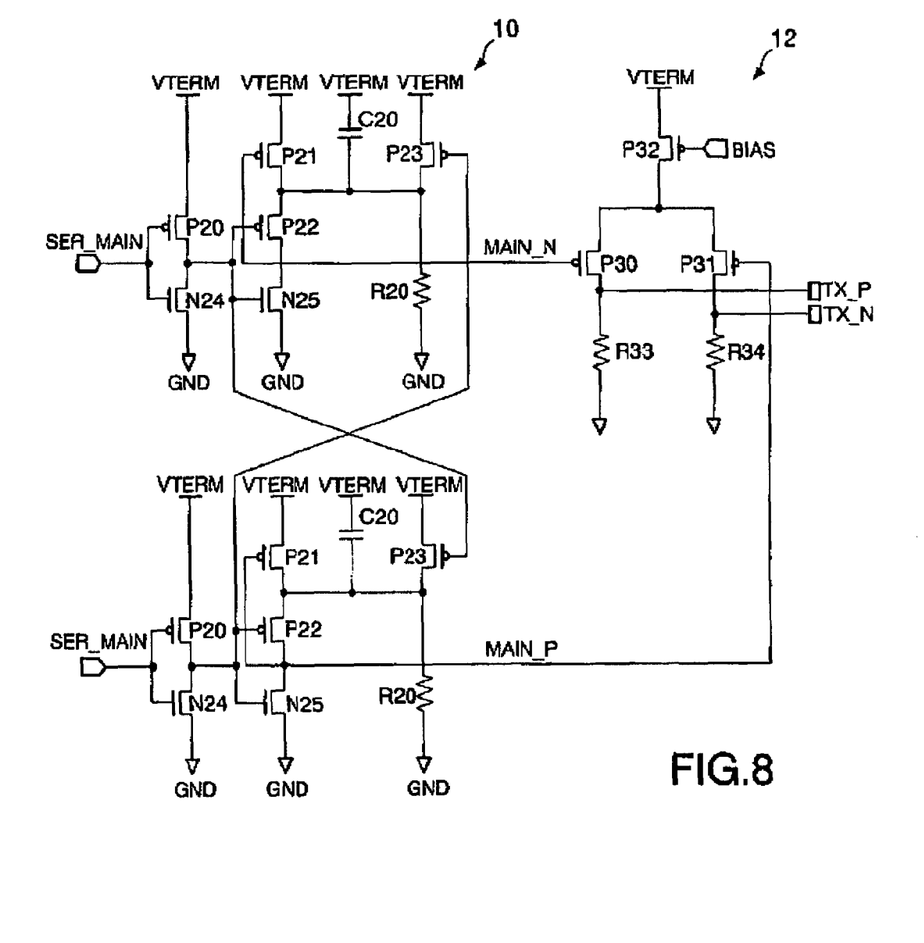
FIG. 8 is a circuit diagram showing the configuration of a driver circuit according to a second embodiment.

In the second embodiment, the aforementioned first embodiment is modified so that the output driver 12 is composed of P-type MOS transistors. FIG. 8 is a diagram showing the configuration of a driver circuit according to this embodiment and corresponds to FIG. 6 described above.

As shown in FIG. 8, the predriver 10 in the driver circuit according to this embodiment includes P-type MOS transistors P20 to P23, N-type MOS transistors N24 and N25, a capacitor C20, and a resistance R20. The output driver 12 includes P-type MOS transistors P30 to P32 and resistances R33 and R34.

The basic role of each element is the same as that in the aforementioned first embodiment. Namely, the transistor P21 is diode-connected and turned off at a point in time when the voltage of the node MAIN (MAIN_N, MAIN_P) becomes higher than a threshold voltage VTHP of the P-type MOS transistor. Therefore, the voltage of the node MAIN does not rise to the voltage VTERM when the node MAIN is high. In other words, the voltage of the node MAIN is maintained in the vicinity of the threshold voltage of the transistors P30 and P31 to which the node MAIN is connected. The capacitor C20 operates such that the voltage of the node MAIN rises rapidly when the node MAIN switches from low to high. These transistor P21, transistor P23, capacitor C20, and resistance R20 constitute a voltage maintaining circuit in this embodiment.

When the node MAIN is low, the transistor P23 is on and electric charge in the capacitor C20 is discharged, and when the node MAIN goes high, the transistor N23 is turned off, and the capacitor C10 is brought into a state capable of accumulating electric charge. The resistance R20 feeds an electric current which compensates for a leakage current flowing through the transistor P21 from the power supply with the voltage VTERM to the ground.

Figure 9:
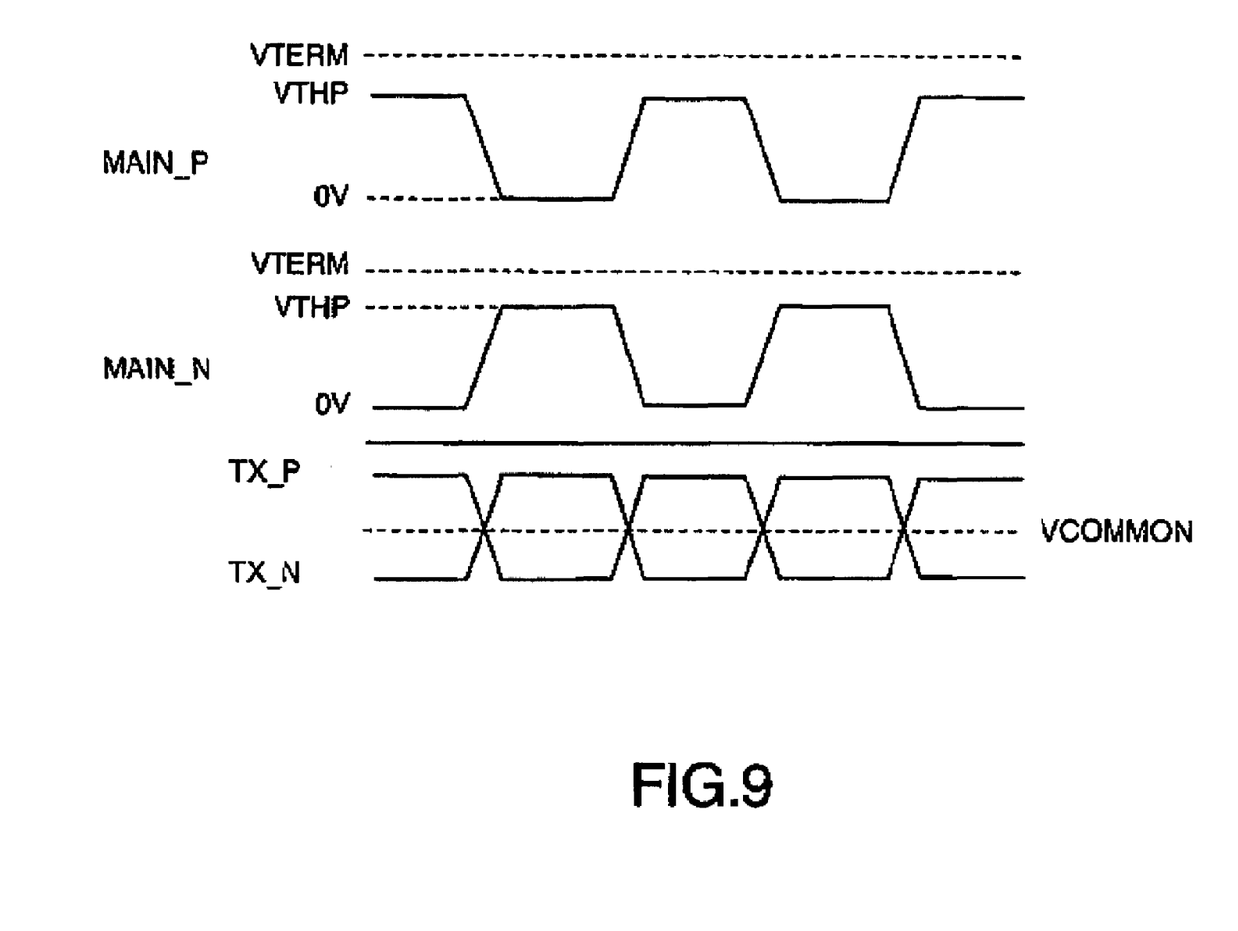
FIG. 9 is a diagram showing operation waveforms of the driver circuit in FIG. 8.

FIG. 9 is a diagram showing operation waveforms of the driver circuit in FIG. 8. As can be seen from FIG. 9, a voltage waveform of the node MAIN_P and a voltage waveform of the node MAIN_N do not rise to the voltage VTERM even at their high level. Therefore, the timings of switching between "on" and "off" of the transistor P30 and the transistor P31 come to coincide. Accordingly, even in timing of switching, the voltage waveform of the output terminal TX_P and the voltage waveform of the output terminal TX_N can keep complementary, whereby fluctuations in VCOMMON can be minimized.

Figure 10:
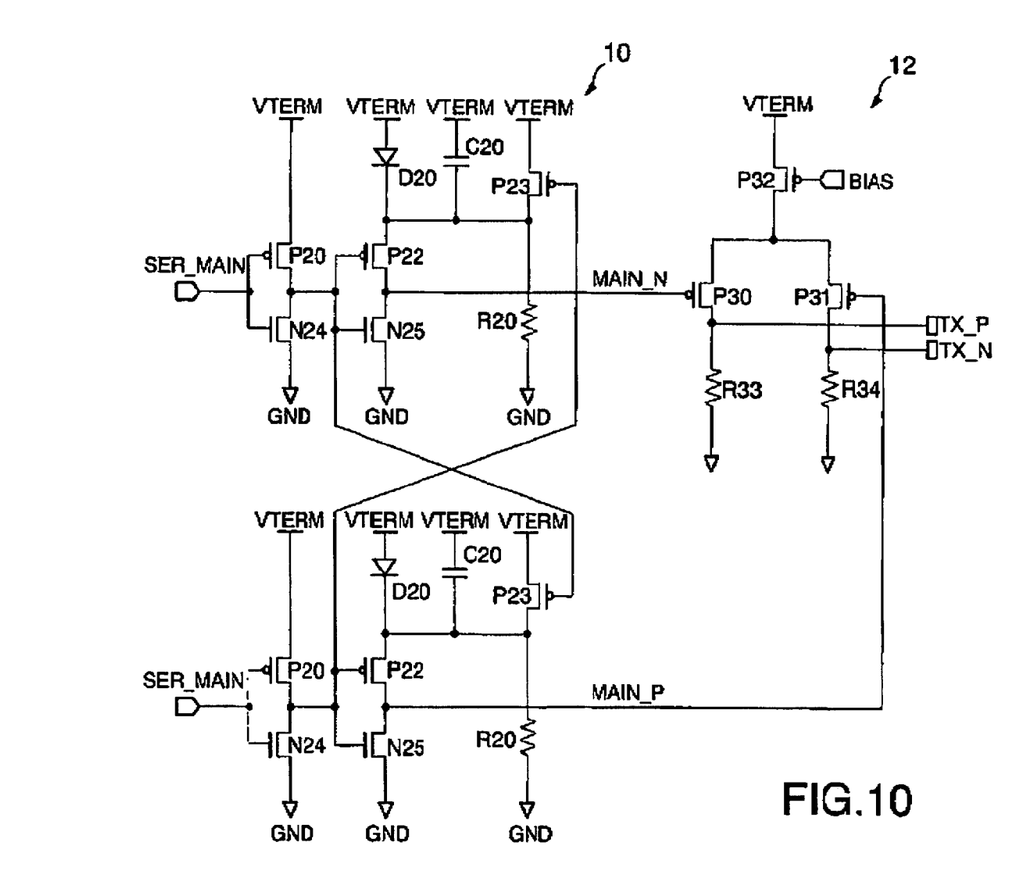
FIG. 10 is a diagram showing a modification of the driver circuit according to the second embodiment.

Incidentally, as shown in FIG. 10, the diode-connected transistor P21 can be replaced with a PN diode D20.

Third Embodiment

Figure 11:
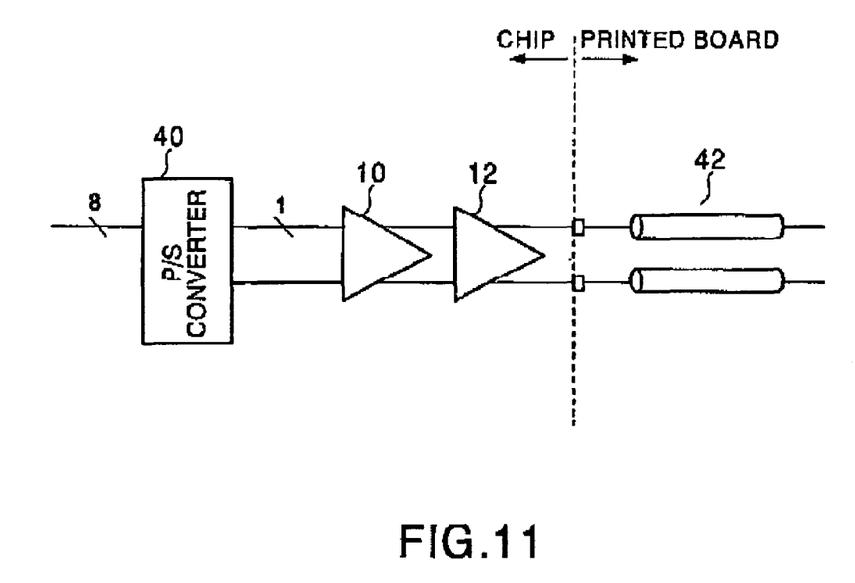
FIG. 11 is a block diagram showing the configuration of a serial interface which uses the driver circuit of each of the embodiments.

FIG. 11 is a diagram showing the configuration of a serial interface to which the driver circuit of the aforementioned first embodiment or second embodiment is applied. As shown in FIG. 11, a 8-bit parallel signal is inputted to a parallel/serial converter 40.

In this parallel/serial converter 40, conversion from a parallel signal to serial signal is performed, and a complementary serial signal is inputted to the predriver 10. This serial signal is amplified to approximately between 10 mA and 15 mA in the predriver 10 and inputted to the output driver 12. In the output driver 12, the complementary signal is amplified to approximately 20 mA and outputted from this chip. The serial signal outputted from the output driver 12 is inputted to a printed board and transmitted via a transmission line 42.

S-ATA, USB, PCI-EXPRESS are examples of the above serial interface.

Fourth Embodiment

Figure 12:
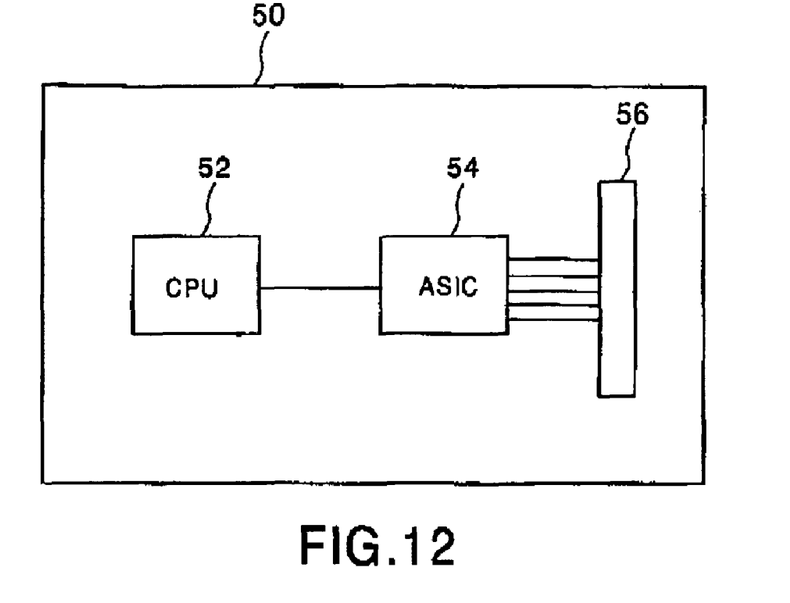
FIG. 12 is a block diagram showing the configuration of a motherboard which uses the serial interface in FIG. 11.

FIG. 12 is a block diagram partially showing the configuration of a motherboard 50 of a personal computer. This motherboard 50 is provided with a CPU 52, an ASIC 54, and an expansion slot 56. In the ASIC 54, the aforementioned driver circuit and parallel/serial converter are formed.

Hence, data on a card inserted into the expansion slot 56 is transmitted to the ASIC 54 with a parallel signal, and the parallel signal is converted into a serial signal in the ASIC 54, amplified, and inputted to the CPU 52.

Figure 13:
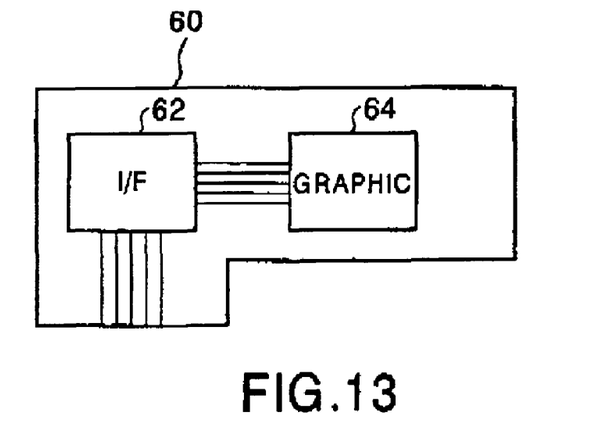
FIG. 13 is a block diagram showing the configuration of a graphic card which is inserted into an expansion slot of the motherboard in FIG. 12.
Figure 14:
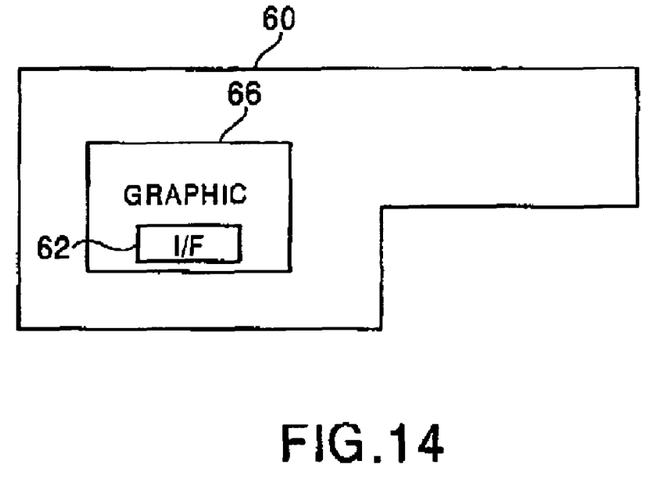
FIG. 14 is a diagram showing a modification of the graphic card in FIG. 13.

FIG. 13 is a block diagram partially showing the configuration of a graphic card 60 inserted into the expansion slot 56. This graphic card 60 is provided with an interface 62 and a graphic chip 64. In the interface 62, the aforementioned driver circuit is formed. Incidentally, the interface 62 may be built in a graphic chip 66 as shown in FIG. 14.

Figure 15:
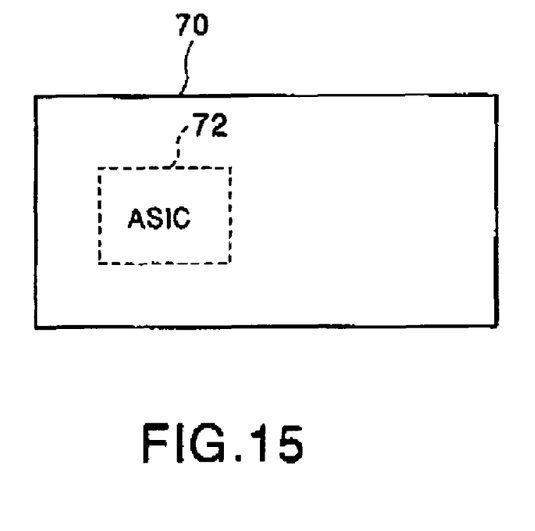
FIG. 15 is a block diagram showing the configuration of a PC card which uses the driver circuit of each of the embodiments.

FIG. 15 is a block diagram partially showing the configuration of a PC card 70 inserted into a PC card slot of a notebook personal computer. This PC card 70 is provided with an ASIC 72, and the aforementioned driver circuit and parallel/serial converter are formed in this ASIC 72. Accordingly, the PC card 70 inserted into the PC card slot exchanges data with the notebook personal computer via the ASIC 72.

It should be mentioned that the present invention is not limited to the aforementioned embodiments, and various changes may be made therein. For example, the driver circuit according to the present invention can be used by being incorporated not only into the motherboard 50, the graphic card 60, and the PC card 70 but also into various other systems.

Respective elements and circuits are not limited to the aforementioned ones but can be realized by other elements and circuits which perform equal operations.

The invention claimed is:

1. A driver circuit, comprising a first inverter which comprises:
   a first transistor which is connected between a first power supply terminal with a first voltage and a first output node;
   a second transistor which is connected between the first output node and a second power supply terminal with a second voltage; and
   a voltage maintaining circuit which is provided between the second power supply terminal and the second transistor and which maintains a voltage of the first output node in the vicinity of a threshold voltage of a transistor which is connected to the first output node even when the second transistor is turned on,
   wherein the voltage maintaining circuit comprises:
   a diode-connected third transistor;

a capacitor which is connected between a first node and the second power supply terminal, the first node being between the second transistor and the third transistor; and a fourth transistor which is connected between the first node and the second power supply terminal.

2. The driver circuit according to claim 1, wherein a capacitance of the capacitor is set so that a voltage obtained through capacitively dividing the first voltage and the second voltage by a stray capacitance of the first output node and the capacitance of the capacitor is in the vicinity of the threshold voltage of the transistor which is connected to the first output node.

3. The driver circuit according to claim 2, wherein the voltage maintaining circuit further comprises a first resistance which is connected between the first node and the first power supply terminal.

4. The driver circuit according to claim 1, wherein the fourth transistor is on while the voltage of the first output node is the first voltage and turned off when the voltage of the first output node switches from the first voltage to the second voltage.

5. The driver circuit according to claim 4, wherein
an input signal is inputted to a gate of the first transistor and a gate of the second transistor, and
a signal obtained by inverting a phase of the input signal is inputted to a gate of the fourth transistor.

6. The driver circuit according to claim 5, wherein the input signal oscillates between the first voltage and the second voltage.

7. The driver circuit according to claim 6, further comprising a second inverter which comprises:
a fifth transistor which is connected between the first power supply terminal and a second output node; and
a sixth transistor which is connected between the second output node and the second power supply terminal, the input signal being outputted from the second output node.

8. The driver circuit according to claim 7, further comprising an output driver which comprises:
a second resistance which is connected between the first power supply terminal and a third output node;
a seventh transistor which is connected between the third output node and the second power supply terminal;
a third resistance which is connected between the first power supply terminal and a fourth output node; and
an eight transistor which is connected between the fourth output node and the second power supply terminal, a first output signal of the driver circuit being outputted from the third output node and a second output signal of the driver circuit being outputted from the fourth output node.

9. The driver circuit according to claim 8, wherein the output driver further comprises a constant current circuit which is connected between a second node and the second power supply terminal, the second node being between the seventh transistor and the eighth transistor.

10. The driver circuit according to claim 9, further comprising a third inverter having the same configuration as the first inverter, an output signal of the first inverter being inputted to a gate of the seventh transistor and an output signal of the third inverter being inputted to a gate of the eighth transistor.

11. The driver circuit according to claim 1, wherein the voltage maintaining circuit comprises a PN diode.

12. The driver circuit according to claim 1, wherein the second voltage is a ground, and the first voltage is a voltage higher than the ground.

13. The driver circuit according to claim 1, wherein the first voltage is a ground, and the second voltage is a voltage higher than the ground.

14. A system including a driver circuit comprising a first inverter which comprises:
a first transistor which is connected between a first power supply terminal with a first voltage and a first output node;
a second transistor which is connected between the first output node and a second power supply terminal with a second voltage; and
a voltage maintaining circuit which is provided between the second power supply terminal and the second transistor and which maintains a voltage of the first output node in the vicinity of a threshold voltage of a transistor which is connected to the first output node even when the second transistor is turned on,
wherein the voltage maintaining circuit comprises:
a diode-connected third transistor;
a capacitor which is connected between a first node and the second power supply terminal, the first node being between the second transistor and the third transistor; and
a fourth transistor connected between the first node and the second power supply terminal.

15. The system according to claim 14, wherein a capacitance of the capacitor is set so that a voltage obtained through capacitively dividing the first voltage and the second voltage by a stray capacitance of the first output node and the capacitance of the capacitor is in the vicinity of the threshold voltage of the transistor which is connected to the first output node.

16. The system according to claim 15, wherein the voltage maintaining circuit further comprises a first resistance which is connected between the first node and the first power supply terminal.

17. The system according to claim 14, wherein the fourth transistor is on while the voltage of the first output node is the first voltage and turned off when the voltage of the first output node switches from the first voltage to the second voltage.

18. The system according to claim 17, wherein
an input signal is inputted to a gate of the first transistor and a gate of the second transistor, and
a signal obtained by inverting a phase of the input signal is inputted to a gate of the fourth transistor.

19. The system according to claim 18, wherein the input signal oscillates between the first voltage and the second voltage.

20. The system according to claim 19, further comprising a second inverter which comprises:
a fifth transistor which is connected between the first power supply terminal and a second output node; and
a sixth transistor which is connected between the second output node and the second power supply terminal the input signal being outputted from the second output node.

* * * * *